US012757705B2

(12) United States Patent
Parteder et al.

(10) Patent No.: US 12,757,705 B2
(45) Date of Patent: Oct. 6, 2026

(54) SEMICONDUCTOR SUBSTRATE COMPRISING A THROUGH-SUBSTRATE-VIA AND METHOD FOR PRODUCING THEREOF

(71) Applicant: ams-OSRAM AG, Premstätten (AT)

(72) Inventors: Georg Parteder, Sankt Ruprecht an der Raab (AT); Peter Jerabek, Graz (AT); Jörg Siegert, Graz (AT); Nebojsa Nenadovic, Wijchen (NL)

(73) Assignee: ams-OSRAM AG, Premstätten (AT)

( * ) Notice: Subject to any disclaimer, the term of this patent is extended or adjusted under 35 U.S.C. 154(b) by 416 days.

(21) Appl. No.: 18/283,837

(22) PCT Filed: Mar. 9, 2022

(86) PCT No.: PCT/EP2022/056010

§ 371 (c)(1),
(2) Date: Sep. 25, 2023

(87) PCT Pub. No.: WO2022/200044

PCT Pub. Date: Sep. 29, 2022

(65) Prior Publication Data

US 2024/0170371 A1 May 23, 2024

(30) Foreign Application Priority Data

Mar. 25, 2021 (DE) ..................... 10 2021 107 474.6

(51) Int. Cl.
*H10W 10/17* (2026.01)
*H10W 20/00* (2026.01)
(Continued)

(52) U.S. Cl.
CPC ......... *H10W 20/20* (2026.01); *H10W 20/023* (2026.01); *H10W 20/075* (2026.01); *H10W 20/425* (2026.01)

(58) Field of Classification Search
CPC . H10W 20/20; H10W 20/023; H10W 20/075; H10W 20/425; H10W 20/0234;
(Continued)

(56) References Cited

U.S. PATENT DOCUMENTS 10,607,924 B1 3/2020 Chiu
2011/0256388 A1* 10/2011 Lim .................... H10W 20/035 428/457

(Continued)

FOREIGN PATENT DOCUMENTS

EP 3 312 874 A1 4/2018

OTHER PUBLICATIONS

International Search Report issued for corresponding International Patent Application No. PCT/EP2022/056010 on Jun. 30, 2022 (3 pages).

(Continued)

*Primary Examiner* — Theresa T Doan
(74) *Attorney, Agent, or Firm* — HAUPTMAN HAM, LLP

(57) ABSTRACT

A semiconductor device includes a substrate—with a rear surface and a main surface, an intermetal dielectric on the main surface of substrate, a metal layer embedded in the intermetal dielectric. The metal layer includes a top barrier layer. The top barrier layer is at a side of the metal layer facing away from the substrate. The semiconductor device also includes a through-substrate-via (TSV) reaching from the rear surface of the substrate to the top barrier layer of the metal layer. The TSV includes a metallization configured to electrically contact the metal layer from the rear surface of the substrate. The TSV includes a via hole. The via hole penetrates the substrate and the intermetal dielectric between the substrate and the metal layer. The via hole further penetrates the metal layer up to the top barrier layer.

8 Claims, 13 Drawing Sheets

(51) Int. Cl.
*H10W 20/20* (2026.01)
*H10W 20/41* (2026.01)

(58) Field of Classification Search
CPC ......... H10W 20/0238; H10W 20/0242; H10W 20/2134; H10W 20/216
USPC .......................................................... 257/758
See application file for complete search history.

(56) References Cited

U.S. PATENT DOCUMENTS

| | | | | |
|---|---|---|---|---|
| 2016/0322519 | A1 | 11/2016 | Schrank et al. | |
| 2018/0019187 | A1 | 1/2018 | Lagouge et al. | |
| 2018/0240753 | A1 | 8/2018 | LaRoche et al. | |
| 2021/0020511 | A1* | 1/2021 | Kraft | H10W 20/023 |

OTHER PUBLICATIONS

Written Opinion issued for corresponding International Patent Application No. PCT/EP2022/056010 on Jun. 30, 2022 (6 pages).

* cited by examiner

SEMICONDUCTOR SUBSTRATE COMPRISING A THROUGH-SUBSTRATE-VIA AND METHOD FOR PRODUCING THEREOF

CROSS REFERENCE TO RELATED APPLICATION

This application is a National Stage of International Application No. PCT/EP2022/056010, filed on Mar. 9, 2022, which designates the United States and was published in Europe, and which claims priority to German Patent Application No. 10 2021 107 474.6, filed on Mar. 25, 2021, in the German Patent Office. All of the aforementioned applications are hereby incorporated by reference in their entireties.

The present invention relates to a semiconductor device, a sensor device comprising a semiconductor device and a method for producing a semiconductor device. The semiconductor device comprises a through-substrate-via.

BACKGROUND OF THE INVENTION

For three-dimensional integration of semiconductor devices through-substrate-vias (TSVs) are used. A TSV is an electric interconnection through a semiconductor substrate. It comprises a via hole penetrating the substrate and a metallization arranged in the via hole.

A TSV can be produced by first forming a metal layer in an intermetal dielectric on a main surface of the substrate. Barrier layers of a different metallic material covering the metal layer improve the adhesion of the intermetal dielectric and prevent diffusion processes like electromigration. Then, the via hole is etched from a rear surface through the substrate, until the intermetal dielectric is reached. An insulating layer is arranged on the sidewall and the bottom of the via hole. The insulating layer and the intermetal dielectric are removed from the bottom of the via hole by an anisotropic etching step, such that the insulating layer remains on the sidewall to cover the semiconductor material. After that etching step, the metal layer is exposed at the bottom of the via hole. The metallization can be applied in the via hole, such that it contacts the metal layer and forms the electric interconnection.

Typically, the current TSV technology is restricted to devices designed in (CMOS−) nodes where specific process options have been chosen. Typically, the TSV technology only works if a bottom barrier layer of the metal layer (from the CMOS front end point of view) and/or the metal layer itself has a significant thickness. This restriction is because of the following reasons:

For example, the TSV "lands" on the bottom barrier layer. This means that the via hole reaches the bottom barrier layer, such that the metal layer is contacted by the metallization of the TSV via the bottom barrier layer. If the bottom barrier layer is too thin, it is damaged due to the etching process sequence leading to the destruction of the barrier functionality. Consequently, cleaning (wet) chemistry can penetrate through the bottom barrier layer and reach the underlying metal layer (typically aluminum). There, the cleaning chemistry can be trapped and attacks the metal layer which in turn is heavily damaged. Hereby, elevated temperatures in subsequent annealing steps in connection with the trapped cleaning chemistry may play a role. It has been observed that in some cases the entire metal layer has been removed (even though the bottom barrier layer was still there).

Besides, it is possible to remove the bottom barrier layer, such that the TSV "lands" on the metal layer (aluminum). This approach is possible as long as the metal layer thickness is high enough, since cleaning chemistry has a non-zero metal etch rate. Thus, the cleaning sequence applied directly on the metal layer at the TSV bottom results in a metal loss. Thus, if the metal layer is too thin, a proper TSV landing cannot be guaranteed.

With the necessity to extend the usability of the TSV technology also to smaller (CMOS−) nodes, the known landing approaches are not possible. Moreover, compatibility with CMOS technologies from different foundries cannot be maintained (increasing the bottom barrier layer thickness in the CMOS backend may not be feasible).

Therefore, an object to be achieved is to provide an improved concept for TSV technology. According to the improved concept, the reliability of TSVs in semiconductor devices is enhanced.

This object is achieved with the subject-matter of the independent claims. Further developments and embodiments are described in dependent claims.

SUMMARY OF THE INVENTION

In an embodiment, a semiconductor device comprises a substrate with a rear surface and a main surface.

An intermetal dielectric is arranged on the main surface of substrate. A metal layer is embedded in the intermetal dielectric. The metal layer comprises a top barrier layer, wherein the top barrier layer is arranged at a side of the metal layer facing away from the substrate. A through-substrate-via, TSV, reaches from the rear surface of the substrate to the top barrier layer of the metal layer. The TSV comprises a metallization being configured to electrically contact the metal layer from the rear surface of the substrate.

The substrate has a main plane of extension. The main surface and the rear surface of the substrate run in lateral directions, wherein lateral direction are parallel to the main plane of extension of the substrate. The substrate may comprise a semiconductor material, e.g. silicon (Si). Circuits and other electrical components can be integrated in the substrate. For example, a CMOS circuit and/or sensor elements are arranged in the substrate.

The intermetal dielectric is arranged on the main surface of the substrate. This can mean that in a vertical direction, the intermetal dielectric is arranged above the substrate. The vertical direction refers to a direction which runs perpendicular to the main plane of extension. The intermetal dielectric can be an oxide, e.g. silicon oxide ($SiO_2$).

The metal layer may especially be part of a wiring, which may comprise several metal layers, for instance. The metal layer may comprise aluminum (Al).

The top barrier layer may comprise titanium (Ti) and/or titanium nitride (TiN). An optional bottom barrier layer may be arranged on a side of the metal layer that faces the substrate. The bottom barrier layer may also comprise Ti and/or TiN. Metal layers of a wiring, which are embedded in an intermetal dielectric, are conventionally provided with barrier layers, in particular in CMOS technology, in order to enhance the adhesion of the dielectric material to the metal layers and in order to prevent diffusion processes like electromigration.

The TSV completely penetrates the substrate opposite the metal layer. The TSV further penetrates the intermetal dielectric between the substrate and the metal layer. The TSV further penetrates the metal layer up to the top barrier layer. This means that the TSV has a vertical extent from the rear surface of the substrate to the top barrier layer. The TSV is aligned with the metal layer. A lateral extent of the TSV is smaller than a lateral extent of the metal layer.

The top barrier layer improves the adhesion of the intermetal dielectric and prevents diffusion processes like electromigration. Besides, from fabrication process point of view, the top barrier layer functions as a etch stop layer during producing a via hole of the TSV. The TSV penetrates the metal layer by a controlled removal of the metal layer. Since the TSV penetrates the metal layer up to the top barrier layer, a reliable electrical contact between the metallization of the TSV and the sidewalls of the remaining metal layer can be established. Thus, the semiconductor device can be electrically contacted from its rear surface. The TSV bottom, i.e. the bottom of the via hole, is not located on the metal layer or on a bottom barrier layer of the metal layer. Thus, electrical contacting does not depend on a respective thickness of the metal layer or of a bottom barrier layer. The electric contact of the TSV is more reliable.

In an embodiment, the TSV comprises a via hole. The via hole penetrates the substrate. The via hole further penetrates the intermetal dielectric between the substrate and the metal layer. The via hole further penetrates the metal layer up to the top barrier layer.

The via hole is formed by a removal of a portion of the substrate, a portion of the intermetal dielectric and a portion of the metal layer up to the top barrier layer. In other words, the via hole "lands" on the top barrier layer. Thus, the bottom of the via hole, is not located on the metal layer or on a bottom barrier layer of the metal layer. The metal layer is therefore removed in a controlled way. Cleaning chemistry cannot be trapped between a bottom barrier layer and the top barrier layer. As a result, electrical contacting does not depend on a respective thickness of the metal layer or of a bottom barrier layer.

In an embodiment, the metal layer, apart from the top barrier layer, forms a ring around the TSV. A side surface of the ring is in direct contact with the metallization of the TSV forming a contact area for establishing an electrical interconnection.

The contact area between the metallization of the TSV and the metal layer forms a vertical electrical contact. This means that in a cross-sectional view the contact area runs in the vertical direction. An electrical interconnection may also be established via the top barrier layer that forms a further contact area with the metallization of the TSV. The further contact area is essentially plane. The further contact area runs in lateral directions.

Since the TSV penetrates the metal layer up to the top barrier layer, a reliable electrical contact between the metallization of the TSV and the sidewalls of the metal layer can be established. The contact area (and the further contact area) can be large, so that a contact resistance is minimal. Thus, an Ohmic contact can be established.

In an embodiment, the TSV further comprises an insulating layer being arranged on a sidewall of the TSV. Thus, the substrate is electrically isolated from the metallization of the TSV.

The insulating layer comprises, for example, $SiO_2$. The insulating layer covers the sidewall of the via hole. Portions of the insulating layer may typically also cover the rear surface of the substrate outside the via hole. By means of the insulating layer short circuits are avoided. The substrate can be at an electric potential that is different from an electrical potential of the TSV.

In an embodiment, the metallization of the TSV comprises a sidewall portion covering a sidewall of the TSV. The metallization further comprises a base portion covering the top barrier layer of the metal layer.

The sidewall portion of the metallization may cover the insulating layer, such that the insulating layer separates the substrate from the metallization. A part of the sidewall portion of the metallization forms the contact area with the metal layer. The base portion of the metallization forms the further contact area with the top barrier layer, which can be metallic.

The sidewall portion and the base portion ensure a continuous metallization from the rear surface of the substrate to the top barrier layer. The metallization may be formed as a layer covering the sidewall and the top barrier layer, respectively. Thus, the remaining via hole may be void/not filled. This can be beneficial in view of thermal and mechanical stress and material consumption.

In an embodiment, the sidewall portion of the metallization tapers conically to the base portion of the metallization at the metal layer.

In other words, the metallization can form a truncated cone towards the top barrier layer. The conical taper of the metallization can be achieved by removing the metal layer during forming the via hole by a carefully chosen etching step. By means of a conically taper the metallization can have a uniform thickness ensuring a reliable electric connection. Moreover, the contact area is well defined.

In an embodiment, the sidewall portion of the metallization widens towards the base portion of the metallization at the metal layer.

The widening of the metallization can be achieved by removing the metal layer during forming the via hole by an etching step with lateral over-etching. This can ensure that the top barrier layer is exposed. The resulting lateral undercut can be filled by the metallization, so that an electrical connection is reliably ensured.

In an embodiment, the metal layer further comprises a bottom barrier layer. The bottom barrier layer is arranged at a side of the metal layer facing the substrate. The bottom barrier layer is penetrated by the TSV.

The bottom barrier layer improves the adhesion of the intermetal dielectric and prevents diffusion processes like electromigration. The TSV penetrates the bottom barrier layer by a controlled removal of the bottom barrier layer during forming the via hole. Since the TSV penetrates the bottom barrier layer and the metal layer up to the top barrier layer, a reliable electrical contact between the metallization of the TSV and the sidewalls of the metal layer can be established. Thus, the semiconductor device can be electrically contacted from its rear surface. The TSV bottom, i.e. the bottom of the via hole, is not located on the bottom barrier layer of the metal layer. Thus, electrical contacting does not depend on a thickness of the bottom barrier layer. The electric contact of the TSV is more reliable.

In an embodiment, the metal layer comprises aluminum (Al). The metal layer may be doped with copper (Cu) and/or silicon (Si). Thus, the metal layer may form an AlSi or AlCu layer. Aluminum has suitable electrical properties and is compatible with CMOS fabrication. Moreover, aluminum layers can be structured by suitable metal etch sequences.

In an embodiment the top barrier layer of the metal layer comprises titanium (Ti) and/or titanium nitride (TiN). In an embodiment, the bottom barrier layer of the metal layer comprises titanium and/or titanium nitride.

Barrier layers for metal systems are essential in submicron integrated devices to ensure high reliability such as resistance to electromigration, hillocks, stress-induced voids etc. Titanium, titanium nitride or combinations thereof are suitable for these applications. They are also compatible with CMOS processes. Barrier layers comprising Ti and/or TiN can be used as etch stop layers during forming the TSV.

In an embodiment, the semiconductor device further comprises a passivation layer covering the metallization within the TSV. The passivation layer may comprise a dielectric material, for example, silicon oxide and/or silicon nitride. At least one opening in the passivation layer may provide access to the metallization or to a contact pad, respectively, at the rear surface of the substrate. Thus, a bump contact or a similar external electric terminal can be applied.

The passivation layer protects the semiconductor device, and in particular the TSV, from physical damage. The passivation layer covers exposed metal layers, such as the metallization of the TSV.

In an embodiment, the semiconductor device further comprises at least one further metal layer embedded in the intermetal dielectric. The further metal layer comprises a further top barrier layer. The further top barrier layer is arranged at a side of the further metal layer facing away from the substrate. The further metal layer has a larger distance from the substrate than the metal layer.

The semiconductor device further comprises at least one further TSV. The further TSV reaches from the rear surface of the substrate to the further top barrier layer of the further metal layer. The further TSV comprises a further metallization being configured to electrically contact the further metal layer from the rear surface of the substrate.

The further metal layer may also be part of a wiring. Details mentioned above for contacting the metal layer by means of the TSV also apply to contacting the further metal layer by means of the further TSV. This means, all features disclosed for the metal layer and the TSV are also disclosed for the further metal layer and the further TSV, and vice-versa.

Advantageously, the semiconductor device can comprise more than one TSV, wherein different metal layers of a metal stack are contacted from the rear surface. In conventional devices, only one metal layer (e.g. the first metal layer, MTL1) is suitable, in terms of an appropriate metal layer thickness or bottom barrier layer thickness, to be contacted by a TSV. Due to the proposed concept all metal layers of a semiconductor device can be contacted by a TSV, as a reliable electrical contact is not dependent on said thicknesses.

Furthermore, a sensor device is provided that comprises the semiconductor device. This means that all features disclosed for the semiconductor device are also disclosed for and applicable to the sensor device and vice-versa.

In an embodiment, the sensor device is an ambient light sensor. In another embodiment, the sensor device is a color sensor. In another embodiment, the sensor device is a proximity sensor. In another embodiment, the sensor device is a photon counting sensor. In another embodiment, the sensor device is a time-of-flight sensor. According to an aspect of the invention, the sensor device comprises a sensor behind an organic light emitting diode (OLED) display.

The mobile handset market will continue to follow the trend to ever higher screen-to-body ratios and ultimately to all-screen, bezel-less smartphones. For that purpose, sensor elements comprised by such devices have to be highly integrated, such that 3D-integration techniques are needed. Advantageously, the sensor devices used comprise semiconductor devices with TSVs, through which electrical contacting from the rear surface is possible. A terminal device, such as a smartphone, can thus be designed to be very thin. The front of the terminal device can, for example, be completely filled by a screen, e.g. an OLED display.

Furthermore, a method for producing a semiconductor device is provided. All features disclosed for the semiconductor device and the sensor device are also disclosed for the method for producing a semiconductor device and vice-versa.

According to at least one embodiment, the method comprises providing a substrate with a rear surface and a main surface. The substrate may comprise a semiconductor material, e.g. silicon (Si).

The method further comprises arranging an intermetal dielectric and a metal layer embedded in the intermetal dielectric on the main surface of substrate. The metal layer comprises a top barrier layer arranged at a side of the metal layer facing away from the substrate. The intermetal dielectric can be an oxide, e.g. silicon oxide ($SiO_2$). The intermetal dielectric can be deposited on the substrate in one or more deposition steps, e.g. via chemical vapor deposition (CVD). The metal layer may comprise aluminum (Al). The top barrier layer may comprise titanium (Ti) and/or titanium nitride (TiN). The metal layer and the top barrier layer may be deposited by sputter processes between two subsequent deposition steps of the intermetal dielectric. Patterning of the metal layer can be conducted by etching.

The method further comprises forming a through-substrate-via, TSV, from the rear surface of the substrate to the top barrier layer of the metal layer. The TSV comprises a metallization being configured to electrically contact the metal layer from the rear surface of the substrate.

This means that the TSV extends from the rear surface of the substrate towards the top barrier layer. The TSV can be formed by a sequence of etching steps in order to remove a portion of the substrate, the intermetal dielectric between the substrate and the metal layer, and the metal layer up to top barrier layer. The top barrier layer can be used as etch stop layer. The metallization is applied to the etched structure, such that the exposed remaining portion of the metal layer is electrically contacted.

Advantageously, the top barrier layer can function as an etch stop layer during producing a via hole of the TSV. The TSV penetrates the metal layer by a controlled removal of the metal layer. Since the TSV penetrates the metal layer up to the top barrier layer, a reliable electrical contact between the metallization of the TSV and the sidewalls of the remaining metal layer can be established. Thus, the semiconductor device can be electrically contacted from its rear surface. The TSV bottom, i.e. the bottom of the via hole, is not located on the metal layer or on a bottom barrier layer of the metal layer. Thus, electrical contacting does not depend on a respective thickness of the metal layer or of a bottom barrier layer. The electric contact of the TSV is more reliable.

According to at least one embodiment, forming the TSV comprises forming a via hole by removing the substrate opposite the metal layer.

The via hole can be formed by deep reactive-ion etching (DRIE) into the silicon substrate. The DRIE process can be controlled by time or by use of an etch stop layer, in particular by use of the intermetal dielectric as etch stop layer. The DRIE process is also called Bosch process. DRIE is a fast and efficient anisotropic etching technique.

Forming the TSV further comprises extending the via hole by removing the intermetal dielectric up to the metal layer. This means that a further etching step removes the intermetal dielectric between the substrate and the metal layer. For the second etching step, the metal layer can be used as etch stop layer. The further etching step exposes the metal layer. The further etching step can be followed by a further cleaning procedure in order to remove etch residues. The cleaning chemistry could attack the metal layer (typically aluminum). However, as the metal layer is removed in a subsequent etching step anyway, the cleaning chemistry does not harm the semiconductor device and does not affect the electrical contact.

Forming the TSV further comprises further extending the via hole by removing the metal layer up to the top barrier layer. This means that an additional etching step removes the metal layer up to the top barrier layer. The additional etching step may use an etchant that is selective to the material used for the metal layer, but does not attack the top barrier layer. For example, the etchant attacks Al, but does not attack Ti and/or TiN. The additional etching step for removing the metal layer can be chosen such that the etched structure tapers conically to the top barrier layer. As an alternative, the additional etching step for removing the metal layer can be chosen such that the etched structure widens towards the top barrier layer. This can be achieved by removing the metal layer with lateral over-etching. By means of the additional etching step for further extending the via hole the metal layer is removed in a controlled way.

According to at least one embodiment, forming the TSV further comprises, after removing the intermetal dielectric up to the metal layer and before removing the metal layer up to the top barrier layer, depositing an insulating layer on a sidewall of the via hole.

The insulating layer comprises, for example, $SiO_2$. The deposition of the insulating layer can be conducted by CVD. The insulating layer covers the sidewall of the via hole. Portions of the insulating layer may typically also cover the bottom of the via hole, i.e. the metal layer, and the rear surface of the substrate outside the via hole. After the deposition the insulating layer is removed from the bottom of the via hole by an anisotropic etching step, such that the metal layer is exposed.

In an alternative embodiment, the insulating layer is deposited after removing the substrate opposite the metal layer and before removing the intermetal dielectric. In this embodiment, the insulating layer can be removed from the bottom of the via hole in the same anisotropic etching step that is also used for removing the intermetal dielectric.

By means of the insulating layer the substrate is electrically isolated from the metallization of the TSV and short circuits are avoided.

Forming the TSV further comprises, after removing the metal layer up to the top barrier layer, depositing the metallization of the TSV, such that a sidewall portion of the metallization covers the sidewall of the via hole and a base portion of the metallization covers the top barrier layer of the metal layer. The metallization is isolated from the substrate by the insulating layer. The metallization is in direct contact with a contact area of the metal layer that surrounds the TSV in lateral directions.

The metallization can be applied as a layer, especially a conformal layer. The metallization may comprise more than one metal and may especially be applied as a sequence of metal layers, which may include titanium and/or tungsten layers, for instance. The metal layer, apart from the top barrier layer, may form a ring around the TSV. A side surface of the ring may be in direct contact with the metallization of the TSV forming a contact area for establishing an electrical interconnection.

Further embodiments of the method become apparent to the skilled reader from the embodiments of the semiconductor device described above.

BRIEF DESCRIPTION OF THE DRAWINGS

The following description of figures may further illustrate and explain aspects of the improved semiconductor device and the method of producing the same. Components and parts of the semiconductor device that are functionally identical or have an identical effect are denoted by identical reference symbols. Identical or effectively identical components and parts might be described only with respect to the figures where they occur first. Their description is not necessarily repeated in successive figures.

In FIG. 1 a conventional approach of a semiconductor device 1 comprising a through-substrate-via 16, TSV, is shown. The semiconductor device 1 is shown up-side-down, since the TSV 16 is usually fabricated by backside handling of a semiconductor wafer.

Figure 1A:
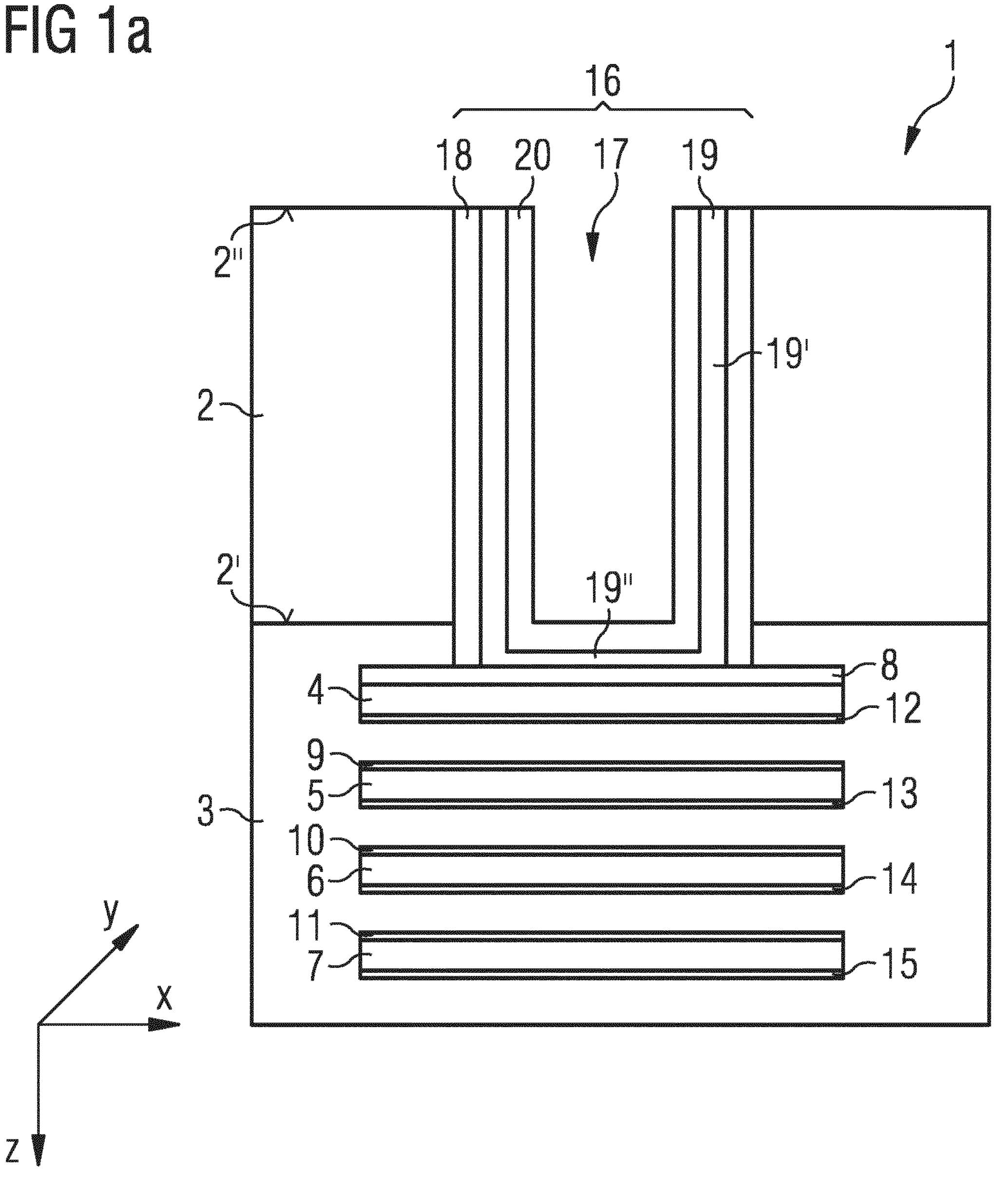
FIG. 1*a* shows an example of a semiconductor device comprising a through-substrate-via.

The semiconductor device 1 comprises a substrate 2 with a rear surface 2" and a main surface 2'. The substrate 2 has a main plane of extension. The rear surface 2" and the main surface 2' run in lateral directions x, y, wherein the lateral directions x, y are parallel to the main plane of extension of the substrate 2.

An intermetal dielectric 3 is arranged on the main surface 2' of substrate 2. This means that in a vertical direction z the intermetal dielectric 3 is arranged above the substrate.

A first, a second, a third and a fourth metal layer 4, 5, 6, 7 are embedded in the intermetal dielectric 3. The metal layers 4 to 7 can be part of a wiring of the semiconductor device 1. FIG. 1 shows four metal layers by way of example. However, the number of metal layers 4 to 7 is only exemplary. FIG. 1 shows that the metal layers 4 to 7 are aligned with each other. However, the metal layers 4, 5, 6, 7 can also be arranged in the intermetal dielectric 3 in a different manner.

Each metal layer 4 to 7 comprises a respective bottom barrier layer 8 to 11. The bottom barrier layer 8 to 11 is arranged on a side of the respective metal layer 4 to 7 that faces the substrate 2. The bottom barrier layer 8 of the first metal layer has a higher thickness than the bottom barrier layers 9 to 11 of the other metal layer 5 to 7.

Besides, the metal layers 4 to 7 each comprise a top barrier layer 12 to 15, wherein the top barrier layer 12 to 15 is arranged at a side of the respective metal layer 4 to 7 facing away from the substrate 2.

A through-substrate-via, TSV 16, reaches from the rear surface 2" of the substrate 2 to the bottom barrier layer 8 of the first metal layer 4. This means that the TSV 16 penetrates the substrate 2 and the intermetal dielectric 3 that is arranged between the substrate and the bottom barrier layer 8.

The TSV 16 comprises a via hole 17. The via hole 17 penetrates the substrate 2 and the intermetal dielectric 3 that is arranged between the substrate and the bottom barrier layer 8.

The TSV 16 further comprises an insulating layer 18. The insulating layer 18 is arranged on a sidewall of the via hole 17, which is formed by the substrate 2 and the intermetal dielectric 3.

The TSV 16 further comprises a metallization 19 being configured to electrically contact the first metal layer 4 from the rear surface 2" of the substrate 2. The metallization 19 forms a continuous layer. The metallization 19 comprises a sidewall portion 19' that covers the insulating layer 18 at the sidewall of the via hole 17. The sidewall portion may thus form a hollow cylinder. The metallization further comprises a base portion 19" that covers the bottom barrier layer 8 at the bottom of the via hole 17. Thus, an electrical is formed between the metallization 19 of the TSV 16 and the first metal layer 4 via the bottom barrier layer 8.

A passivation layer 20 covers the metallization 19 in the via hole 17. Thus, the passivation layer 20 covers both the sidewall portion 19' and the base portion 19" of the metallization 19.

Figure 1B:
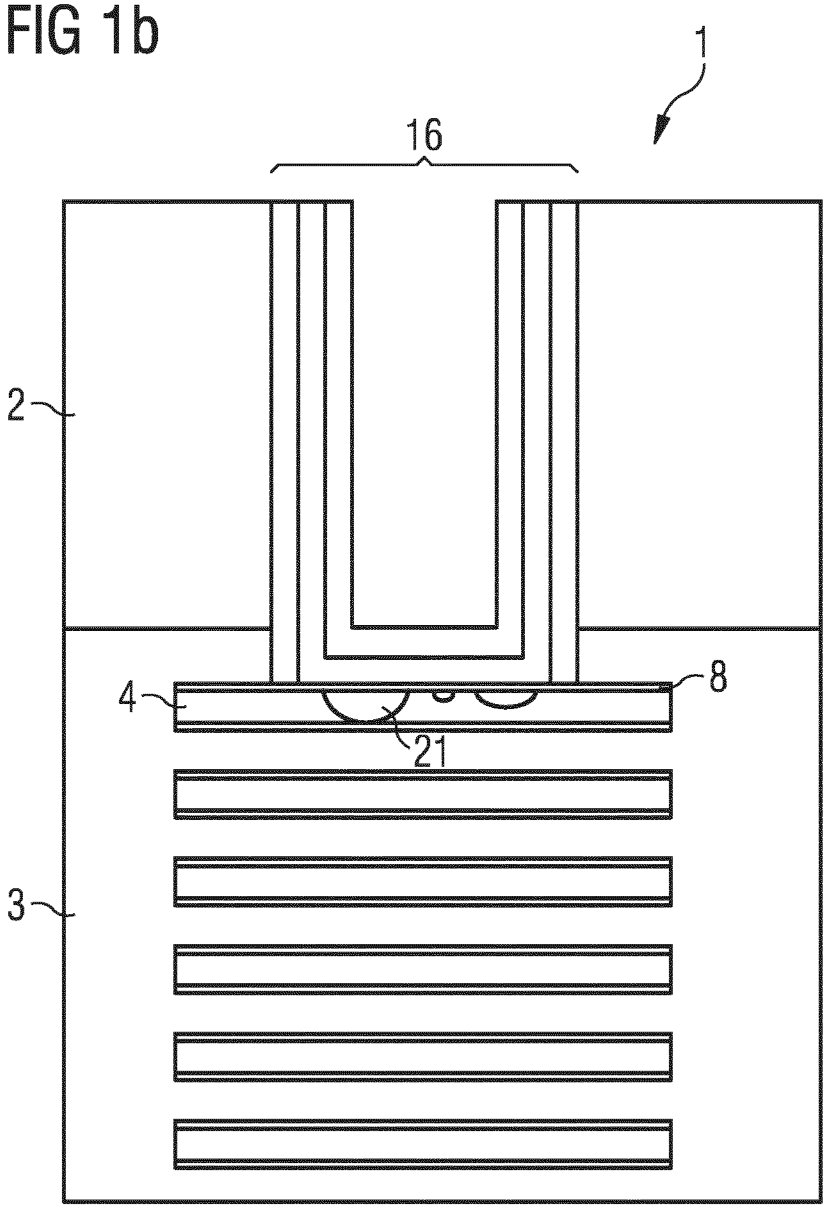
FIG. 1*b* shows another example of a semiconductor device comprising a through-substrate-via.

In this conventional approach the bottom barrier layer 8 of the metal layer to be contacted (in this case the first metal layer 4) has to be thick. If the bottom barrier layer were too thin, as shown in FIG. 1*b*, it would be damaged by the etching process sequence to form the via hole. This would lead to the destruction of the barrier functionality. Consequently, the cleaning chemistry needed to remove etch residues can pass through the bottom barrier layer to the underlying metal layer (typically aluminum). There, the cleaning chemical can be trapped and attack the metal layer, which is severely damaged as a result (see FIG. 1*b*).

For a thick bottom barrier layer 8 of the first metal layer 4 modifications in the CMOS backend process are required. However, in case that CMOS technologies from different foundries are used, compatibility cannot be maintained. The conventional approach as shown in FIG. 1 is therefore not suited for different CMOS technologies. This is especially true when dealing with smaller CMOS nodes where the metal layers 4 to 7 also lose thickness and may not have a bottom barrier layer 8 to 11.

As mentioned above, FIG. 1*b* shows an example using the conventional TSV technology as shown in FIG. 1, but where the bottom barrier layer 8 of the first metal layer 4 is too thin. As described, this could lead to severe damage of the metal layer 4, since cleaning chemistry can be trapped between the barrier layers 8, 12 and attacks the metal layer material. As a consequence, the metal layer 4 can exhibit voids 21 or is even completely removed, as mentioned in the introduction. Therefore, a proper electrical contact cannot be guaranteed.

Figure 1C:
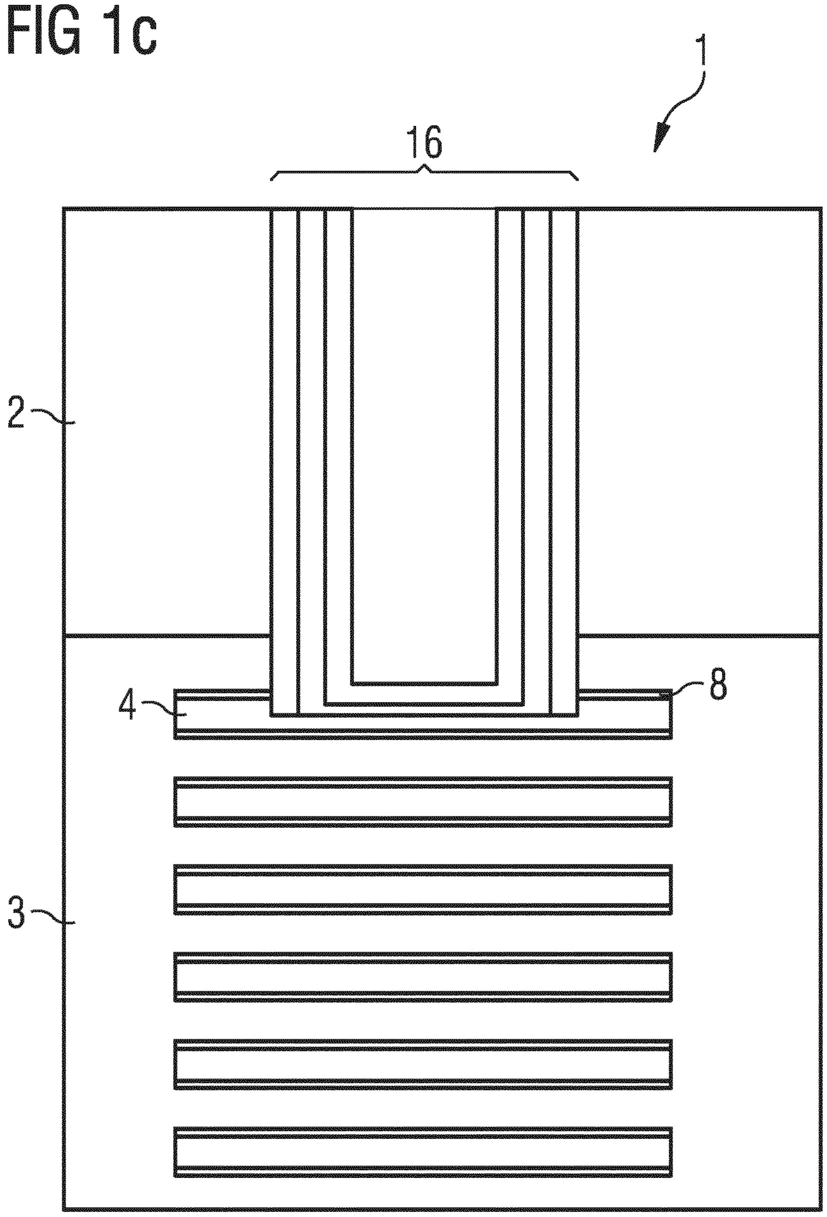
FIG. 1*c* shows another example of a semiconductor device comprising a through-substrate-via.

In FIG. 1*c* another conventional approach is shown. There, a portion of the bottom barrier layer 8 is removed, so the TSV 16 "lands" on the metal layer 4. By removal of the bottom barrier layer 8 cleaning chemistry cannot be trapped. However, this approach is only possible as long as the thickness of the metal layer 4 is high enough, since cleaning chemistry has a non-zero metal etch rate. Thus, if the metal layer is too thin, a proper TSV landing cannot be guaranteed.

Figure 2:
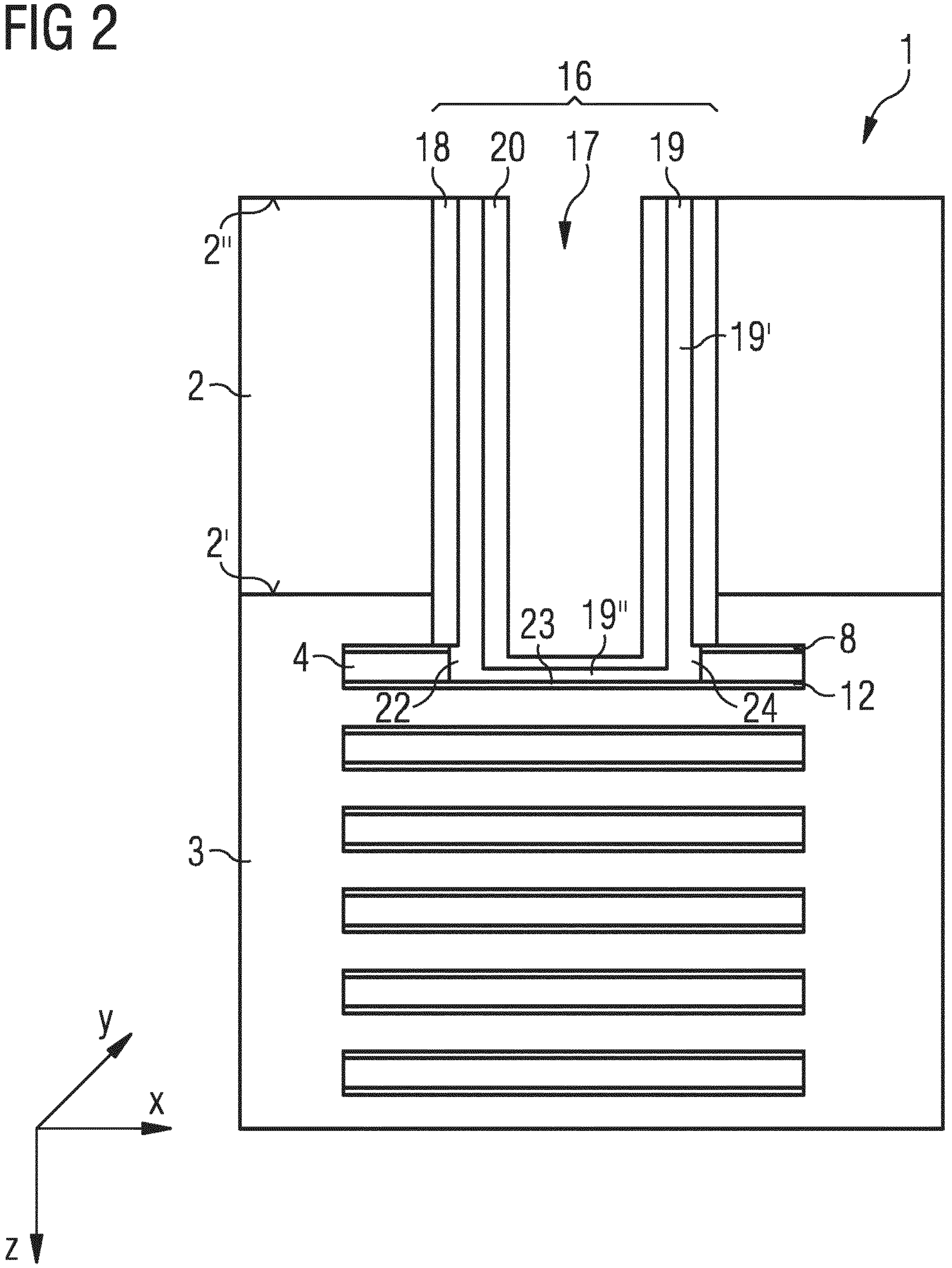
FIG. 2 shows an embodiment of a semiconductor device comprising a through-substrate-via.

In FIG. 2 an embodiment of a semiconductor device 1 comprising a TSV 16 according to the improved concept is shown. As mentioned above, components and parts of the semiconductor device shown in FIG. 2 that correspond to components and parts shown in FIGS. 1*a-c* are denoted by identical reference symbols. For a detailed description of these components it is referred to FIGS. 1*a-c*.

The embodiment according to FIG. 2 is different from the example according to FIG. 1*a* in that the TSV 16 reaches from the rear surface 2" of the substrate 2 to the top barrier layer 12 of the first metal layer 4. This means that the TSV 16 penetrates the substrate 2 and the intermetal dielectric 3 that is arranged between the substrate and the bottom barrier layer 8. Additionally, the TSV 16 penetrates the first metal layer 4 up to the top barrier layer 12.

This means that the via hole 17 comprised by the TSV 16 penetrates the substrate 2, the intermetal dielectric 3 that is arranged between the substrate 2 and the bottom barrier layer 8, and the first metal layer 4 up to the top barrier layer 12.

The removal of the first metal layer 4 can be realized by removing the metal with a dedicated etch step within the TSV process sequence. The landing on the top barrier layer 12 has the advantage that a possible penetration of the cleaning chemistry underneath this layer would not result in any problems as it is observed when landing on the bottom barrier layer 8, because the cleaning chemistry used in the TSV process has no or a negligible oxide etch rate.

The first metal layer 4, apart from its top barrier layer 12, forms a ring around the TSV 16. A side surface of the ring is in direct contact with the metallization 19 of the TSV 16. The side surface of the ring forms a contact area 22 for establishing an electrical interconnection.

An electrical interconnection may also be established via the top barrier layer 12 that forms a further contact area 23 with the metallization 19 of the TSV 16. The further contact area 23 is essentially plane and runs in lateral directions x, y.

At the first metal layer 4 the sidewall portion 19' of the metallization 19 widens towards the base portion 19" of the metallization 19. In other words, the metallization 19 comprises an expanded base 24. This is because in that embodiment an etching step with lateral over-etching is used for removing the metal layer 4 during forming the via hole 17. This results in an undercut in lateral directions x, y, which can be filled by the metallization 19.

Figure 3:
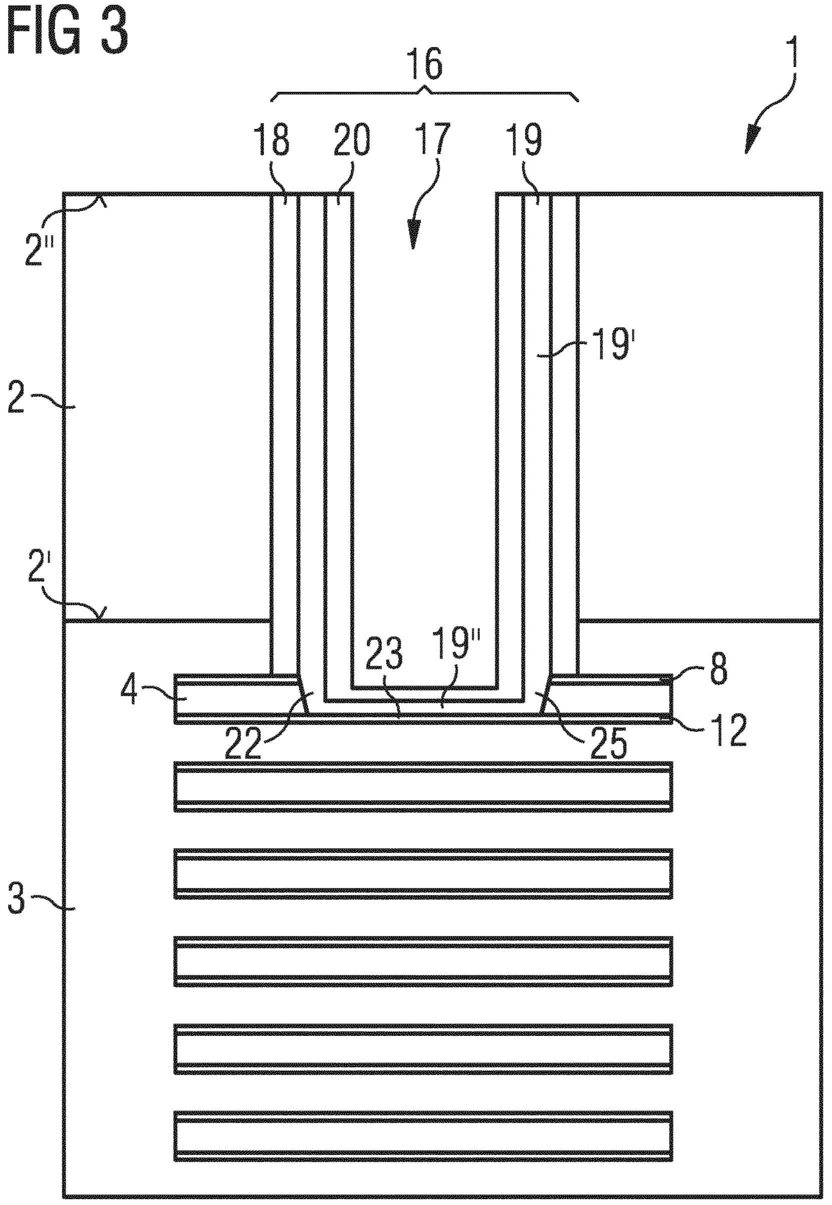
FIG. 3 shows another embodiment of a semiconductor device comprising a through-substrate-via.

In FIG. 3 another embodiment of the semiconductor device 1 is shown. The embodiment according to FIG. 3 is different from the embodiment according to FIG. 2 in that at the first metal layer 4 the sidewall portion 19' of the metallization 19 tapers conically towards the base portion 19" of the metallization 19. In other words, the metallization 19 forms a truncated cone towards the top barrier layer 12, such that the metallization 19 comprises a narrow base 25.

Figure 4:
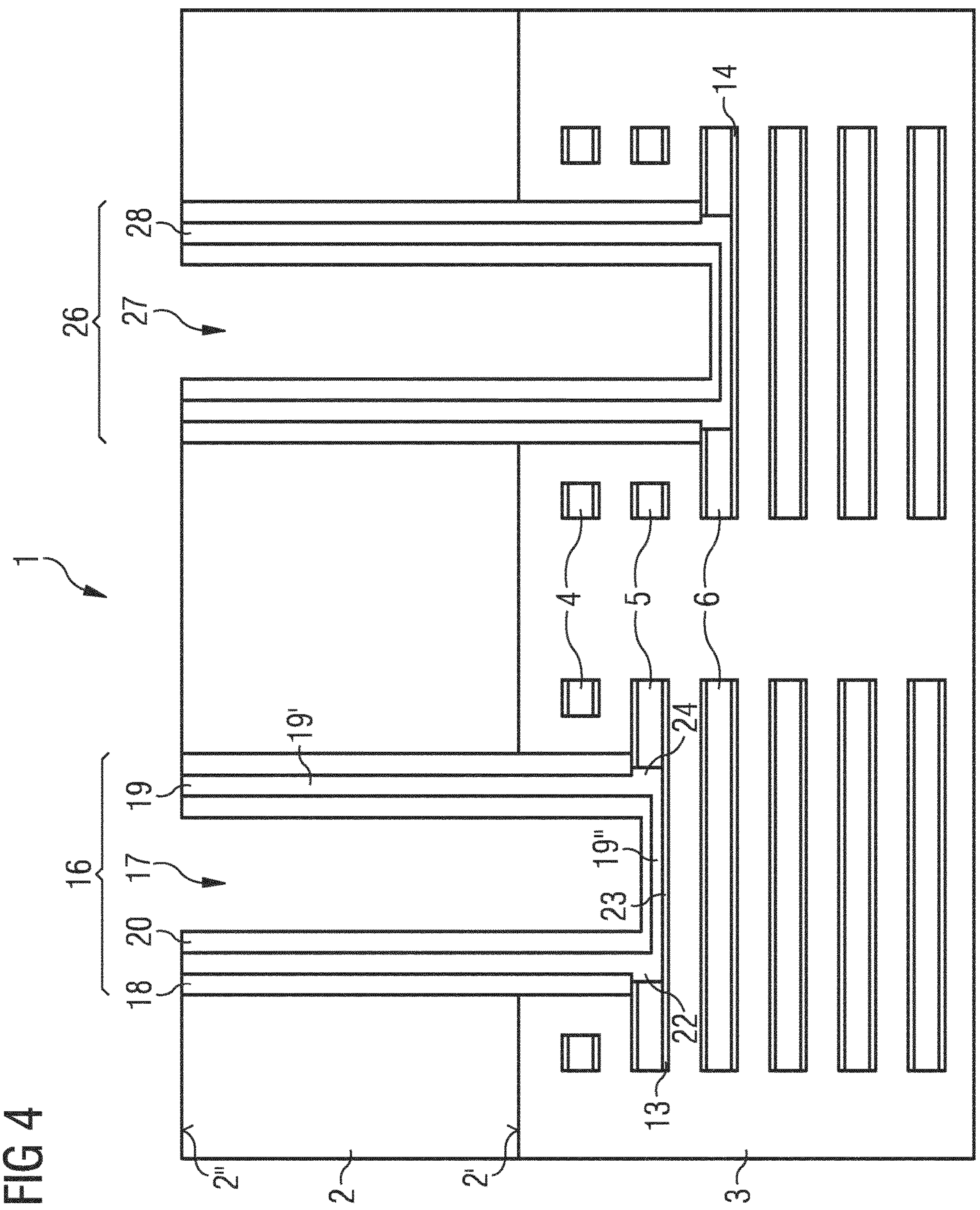
FIG. 4 shows another embodiment of a semiconductor device comprising through-substrate-vias.

In FIG. 4 another embodiment of the semiconductor device 1 is shown. In that embodiment, the second metal layer 5 is electrically contacted by the TSV 16 and the third metal layer 6 is contacted by a further TSV 26. In particular, the TSV 16 reaches from the rear surface 2" of the substrate 2 to the top barrier layer 13 of the second metal layer 5, while the further TSV 26 reaches from the rear surface 2" of the substrate 2 to the top barrier layer 14 of the third metal layer 6. The further TSV 26 comprises a further metallization 28 that is configured to electrically connect the third metal layer 6.

The semiconductor device is not restricted to one TSV 16 or two TSVs 16, 26. The semiconductor device 1 can comprise several TSVs 16, 26 (etc.), wherein different TSVs 16, 26 (etc.) contact different metal layers 5, 6 (etc.) of the semiconductor device 1. As the proposed TSV technology is not restricted to certain metal layer thicknesses, any metal layer 4 to 7 (etc.) within the semiconductor device 1 can be contacted in the proposed way. In other words, TSVs can "land" on the top barrier layer of any metal layer embedded in the intermetal dielectric 3. An oxide etch process with appropriate selectivity can be used for a proper landing on different levels.

The first metal layer 4 is closer to the substrate 2 than the second metal layer 5. Correspondingly, the second metal layer 5 is closer to the substrate 2 than the third metal layer 6.

If a TSV 16, 26 contacts a higher metal layer 5, 6 (greater distance from the substrate 2), then the TSV 16, 26 must pass deeper metal layers 4, 5 (closer to the substrate) without contacting them. This can be achieved by removing the respective deeper metal layers 4, 5 with a metal etch step while forming the respective via holes 17, 27. Alternatively, and as shown in FIG. 4, the structure of deeper metal layers 4, 5 can already be taken into account by the layout (metal ring instead of metal plate).

Figure 5:
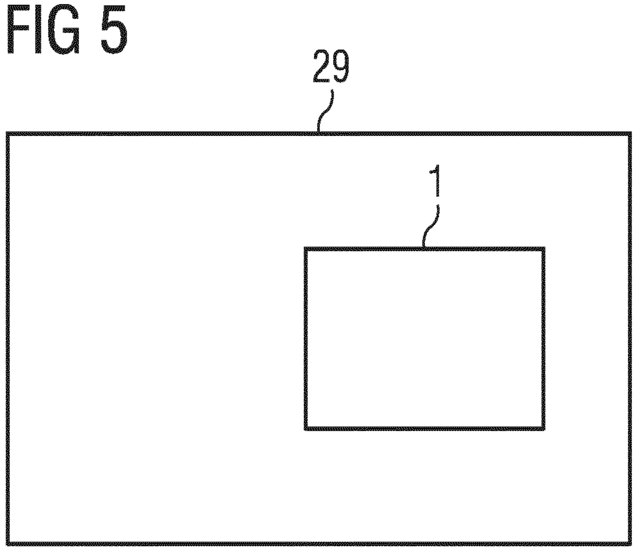
FIG. 5 shows an embodiment of a sensor device comprising the semiconductor device.

In FIG. 5 a sensor device 29 comprising the semiconductor device 1 is shown schematically. The sensor device 29 can be an ambient light sensor, a color sensor, a proximity sensor, a photon counting sensor, and a time-of-flight sensor. The sensor device can be behind an organic light emitting diode display (not shown).

Figure 6A:
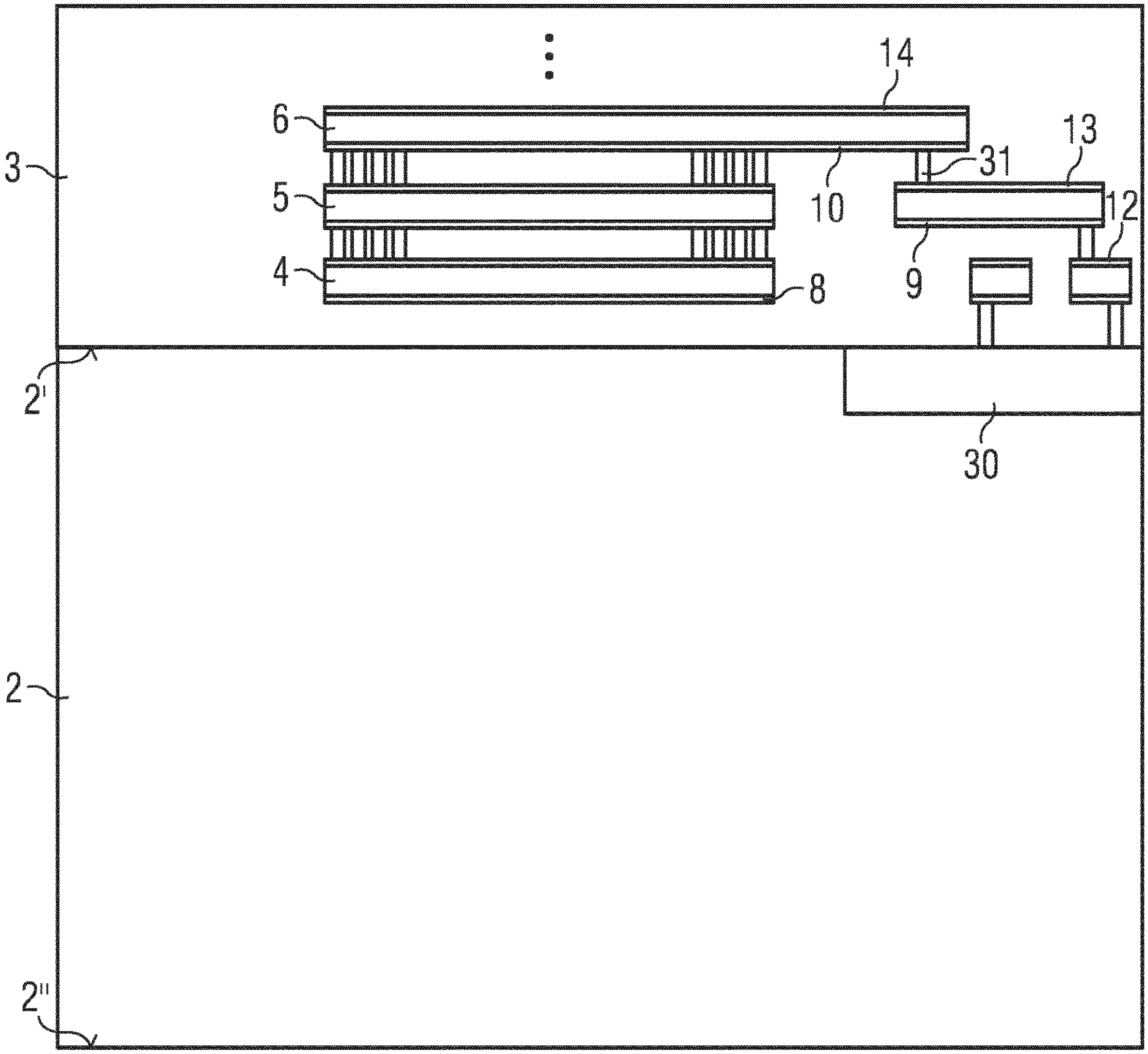
FIGS. 6*a* to 6*f* show an exemplary embodiment of a method of producing a semiconductor device comprising a through-substrate-via.

With FIGS. 6*a* to 6*f* an exemplary embodiment of a method of producing a semiconductor device 1 is shown. The method comprises providing a substrate 2, as shown in FIG. 6*a*. The substrate 2 has a rear surface 2" and a main surface 2'. The substrate 2 can comprise silicon. At the main surface 2' of the substrate 2 a circuit 30, e.g. a CMOS circuit, can be arranged.

On the main surface 2' of the substrate 2 an intermetal dielectric 3 is arranged. The intermetal dielectric 3 can comprise, for example, silicon oxide.

Three metal layers 4 to 6 are embedded in the intermetal dielectric 3. Possible further metal layers are indicated by ellipses. The metal layers 4 to 6 are structured. The metal layers 4 to 6 may comprise aluminum. The metal layers 4 to 6 each comprise a top barrier layer 12 to 14, wherein the top barrier layer 12 to 14 is arranged at a side of the respective metal layer 4 to 6 facing away from the substrate 2. An optional bottom barrier layer 8 to 10 is arranged on a side of the respective metal layer 4 to 6 facing the substrate 2. The barrier layers 8 to 14 may comprise titanium or titanium nitride.

The metal layers 4 to 6 are electrically connected to each other and/or to the circuit 30 by means of contact plugs 31. The contact plugs 31 may comprise tungsten.

Figure 6B:
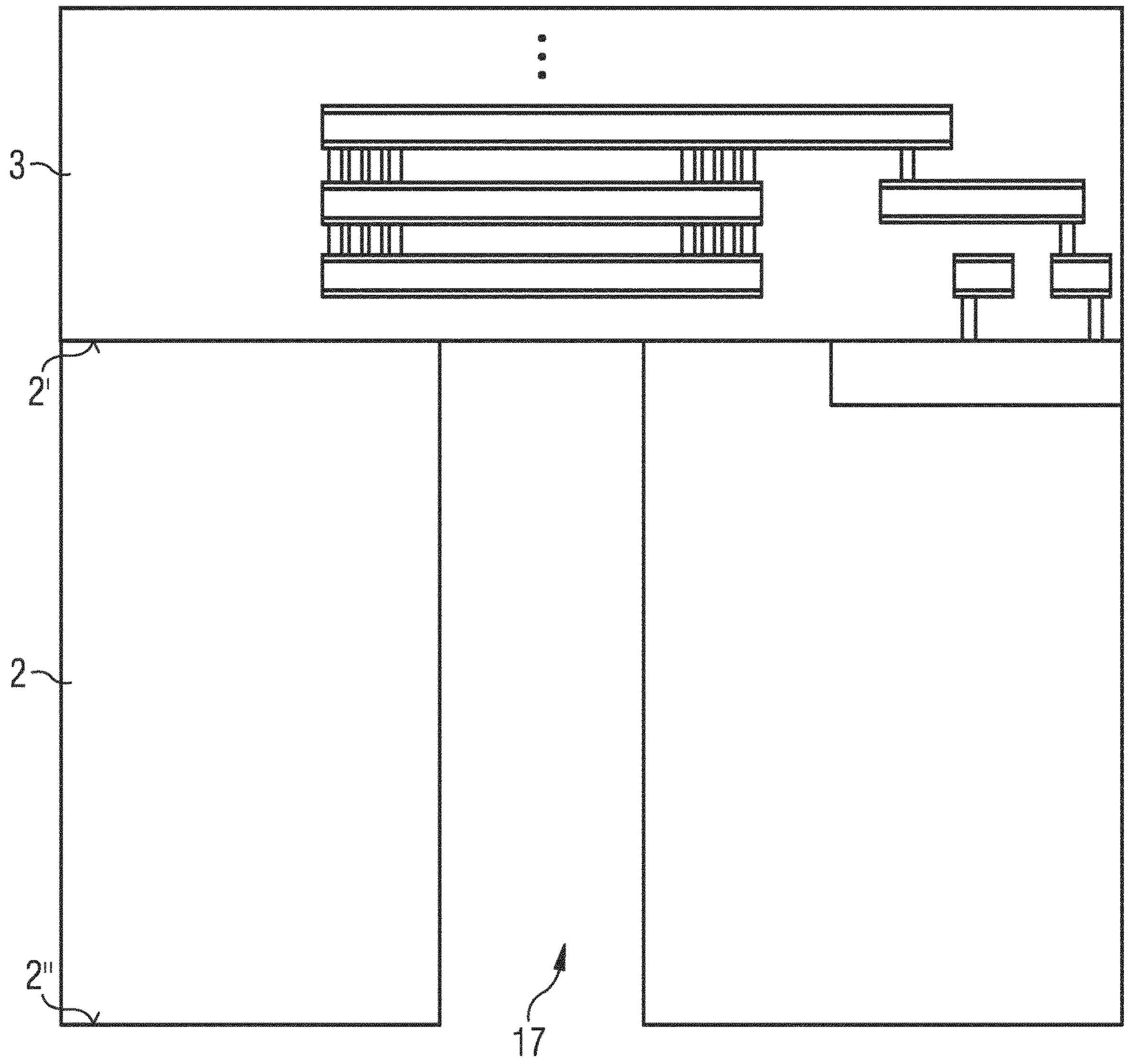

In a next step, as shown in FIG. 6*b*, a via hole 17 is formed. The via hole 17 penetrates the substrate 2 from its rear surface 2" to the main surface 2'. The via hole 17 may be formed by deep reactive ion etching (DRIE). The DRIE process stops at the interface between the substrate 2 and the intermetal dielectric 3.

Figure 6C:
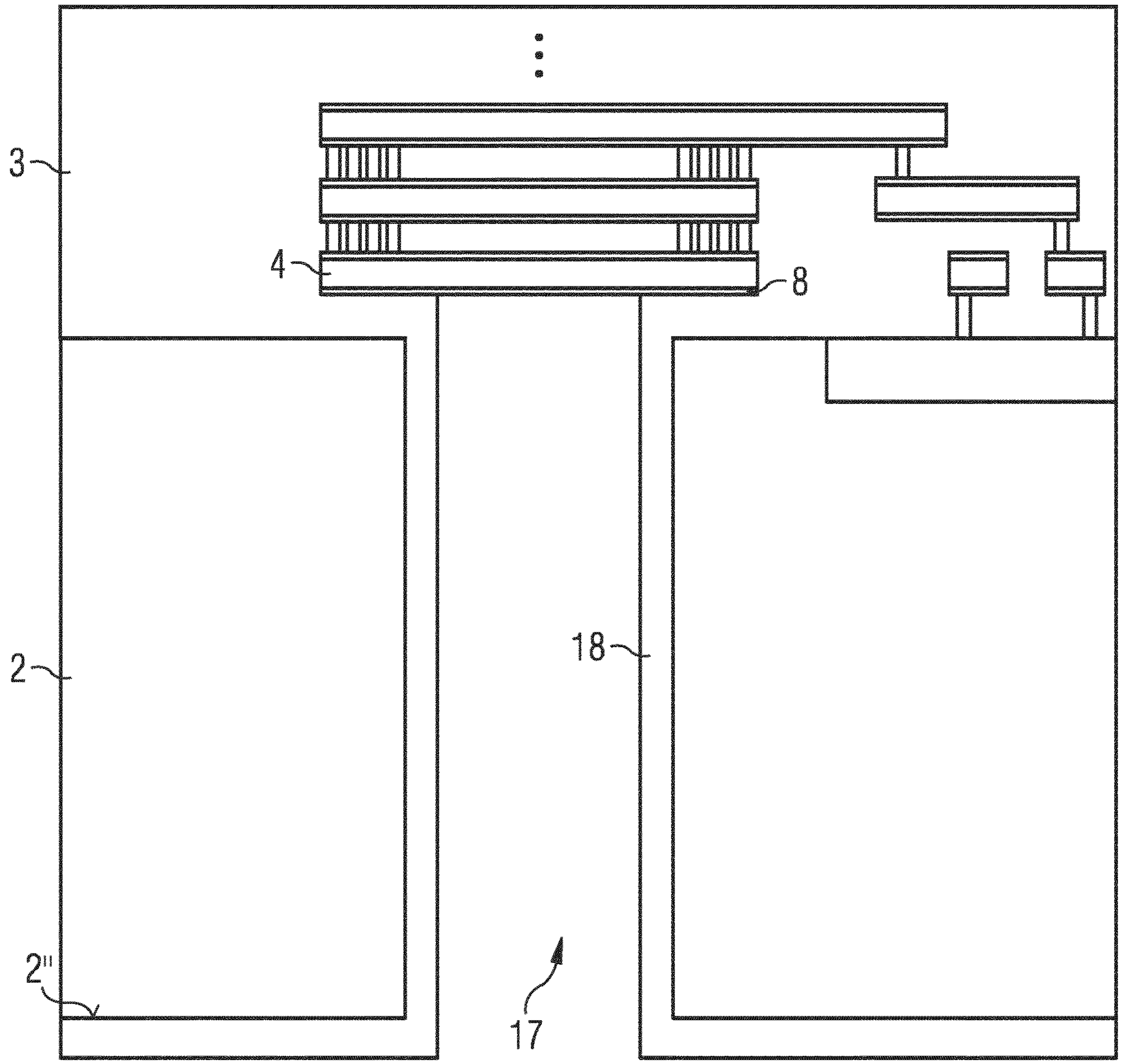

In a next step, as shown in FIG. 6*c*, the via hole 17 is extended by removing the intermetal dielectric 3 up to the metal layer 4. The intermetal dielectric 3 can be removed by means of an oxide etch step. The bottom barrier layer 8 can be used as an etch stop layer.

Furthermore, an insulating layer 18 is applied to the via hole 17. The insulating layer 18 may be applied by deposition, for example. The insulating layer 18 covers a side surface of the via hole 17 and the rear surface 2" of the substrate 2. Portions of the insulating layer 18 may typically also cover the bottom of the via hole 17, however, these portions are removed by an anisotropic etching. The insulating layer 18 may comprise the same material as the dielectric layer 3.

In an alternative embodiment the insulating layer 18 is applied to the via hole 17 before removing the intermetal dielectric 3. In that embodiment, the insulating layer 18 can be removed from the bottom of the via hole 17 in the same anisotropic etching step that is also used for removing the intermetal dielectric 3.

Figure 6D:
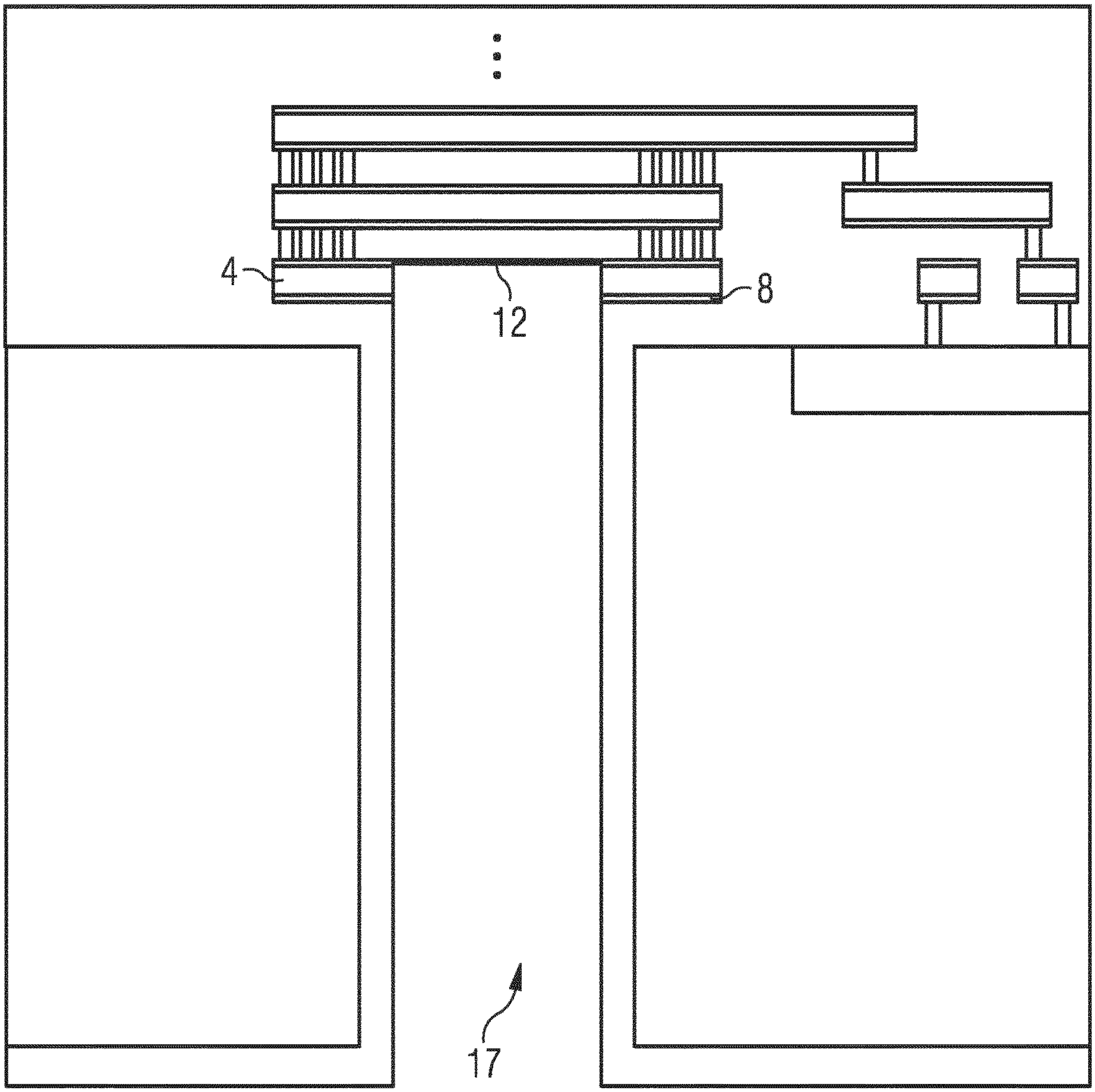

In a next step, as shown in FIG. 6*d*, the via holes 17 is further extended by removing the bottom barrier layer 8 and the metal layer 4. The removal can be conducted by a metal etch step. However, the metal etch step leaves the top barrier layer 12 intact. This can be achieved by using an etchant that is selective to the material used for the metal layer 4, but which does not attack the top barrier layer 12.

Figure 6E:
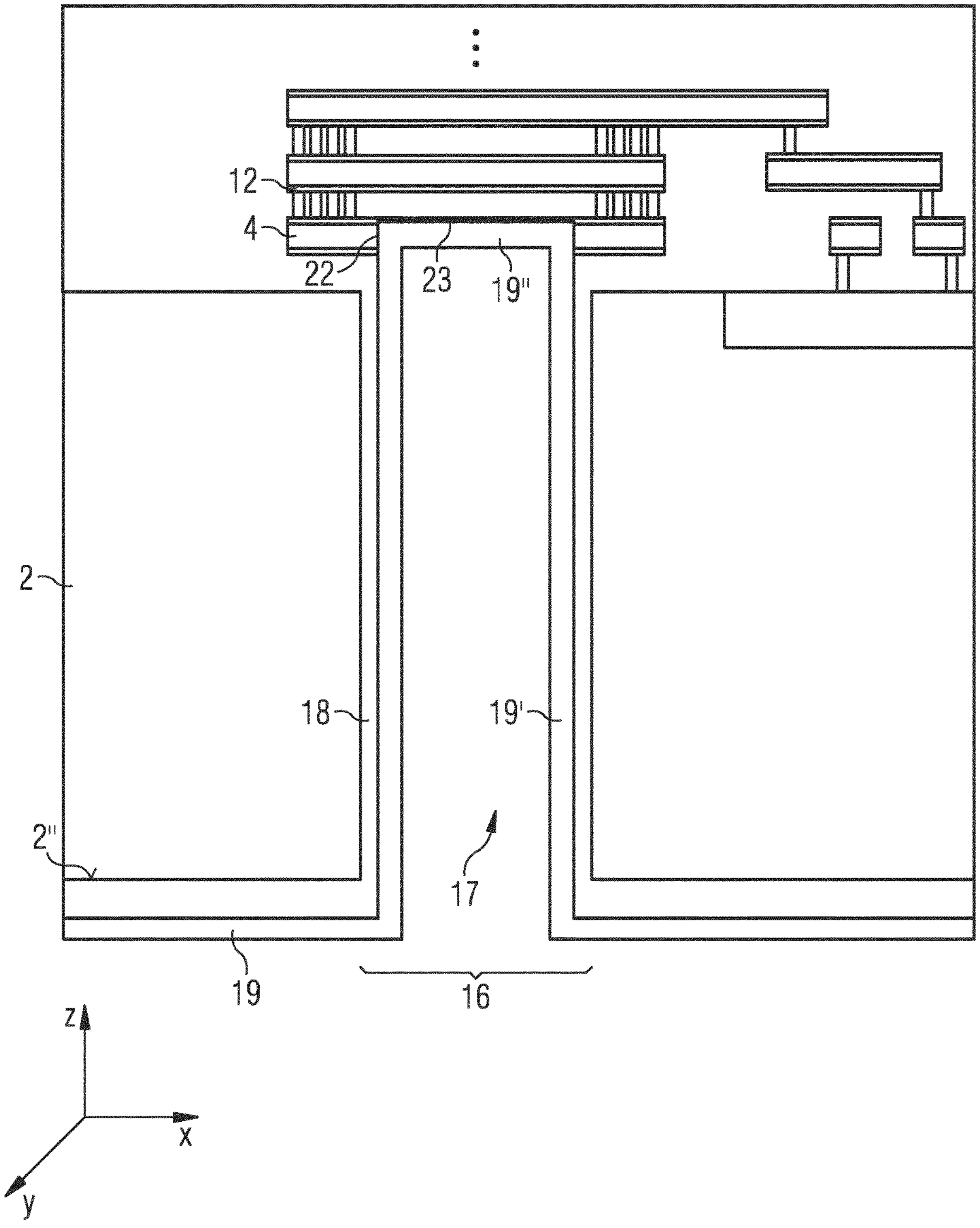

FIG. 6*e* is a cross section according to FIG. 6*d* and shows a further intermediate product after an application of the metallization 19, which is provided for the electrically conductive part of the through-substrate via 16. The metallization 19 can be applied as a layer, especially a conformal layer. The metallization 19 forms a sidewall portion 19' that covers the insulating layer 18 at the sidewall of the via hole 17 and a base portion 19" that covers the top barrier layer 12 of the metal layer 4. Thus, the metallization 19 is isolated from the substrate 2 by the insulating layer 18 and in direct contact with a contact area 22 of the metal layer 4 that surrounds the TSV 16 in lateral directions x, y. The base portion 19" of the metallization 19 forms a further contact area 23 with the top barrier layer 12. A further portion of the metallization 19 may cover the insulating layer 18 at the rear surface 2" of the substrate 2.

Figure 6F:
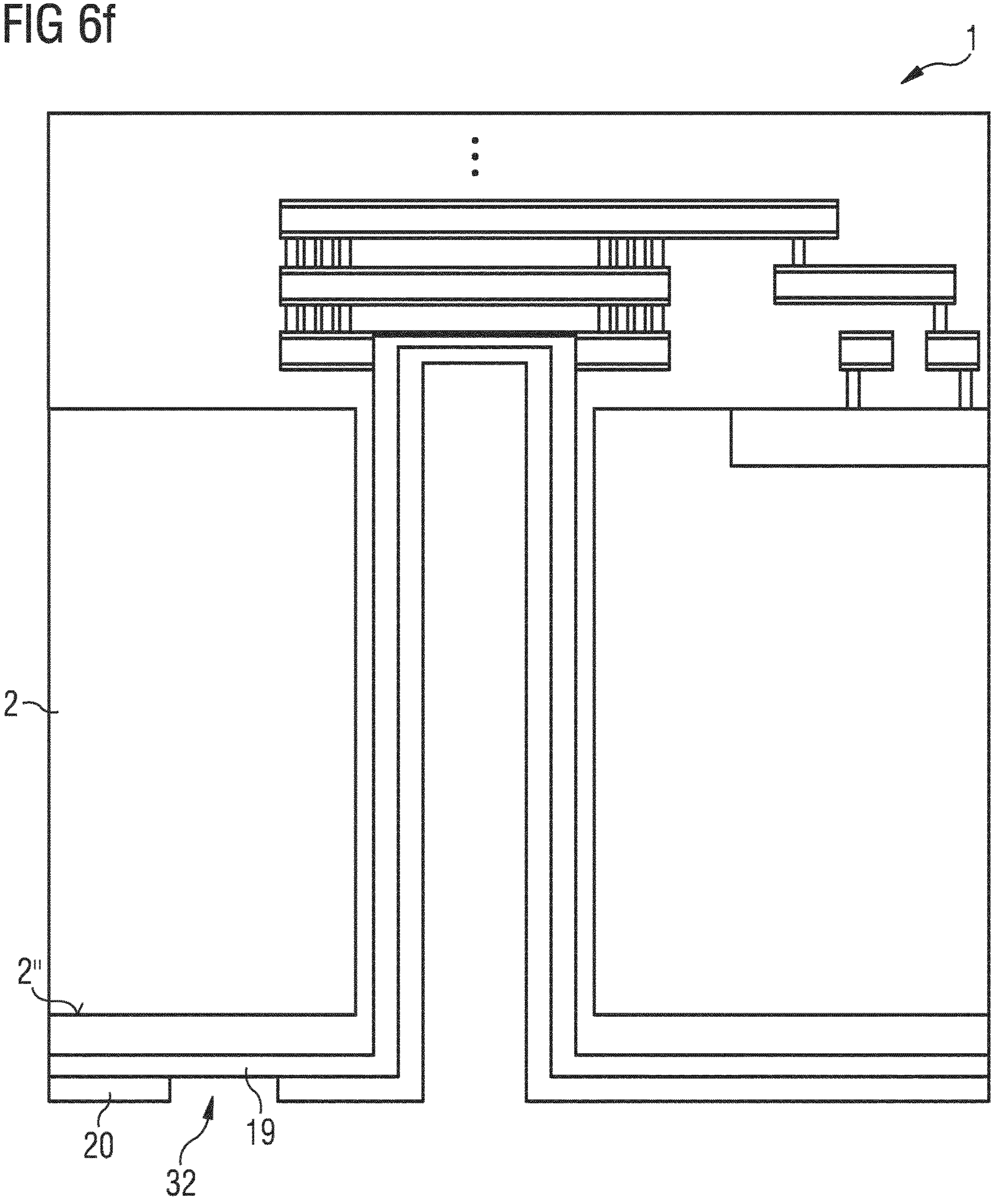

FIG. 6*f* shows the deposition of the passivation layer 20. The passivation layer 20 may be a further dielectric, for instance silicon oxide and/or silicon nitride. At least one opening 32 in the passivation layer 20 may provide access to the metallization 19 at the rear surface 2" of the substrate 2.

By means of the improved concept, there is no need to make adjustments in the CMOS process but only in the layout and/or in the TSV fabrication process. A reliable electric backside contact and full compatibility and usability of CMOS technologies of different foundries can be guaranteed.

The embodiments of the semiconductor device 1 and the method of producing the semiconductor device 1 disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

This patent application claims the priority of German patent application 102021107474.6, the disclosure content of which is hereby incorporated by reference.

REFERENCE SYMBOLS

1 semiconductor device
2 substrate
2' main surface of substrate
2" rear surface of substrate
3 intermetal dielectric
4-7 metal layer
8-11 bottom barrier layer
12-15 top barrier layer
16 through-substrate-via
17 via hole
18 insulating layer
19 metallization
19' sidewall portion
19" base portion
20 passivation layer
21 void
22 contact area
23 further contact area
24 expanded base
25 narrow base
26 further through-substrate-via
27 further via hole
28 further metallization
29 sensor device
30 circuit
31 contact plugs
32 opening
x, y lateral directions
z vertical direction

The invention claimed is:

1. A semiconductor device, comprising:

a substrate with a rear surface and a main surface, an intermetal dielectric arranged on the main surface of substrate, a metal layer embedded in the intermetal dielectric, the metal layer comprising a top barrier layer, wherein the top barrier layer is arranged at a side of the metal layer facing away from the substrate, and a through-substrate-via, TSV, reaching from the rear surface of the substrate to the top barrier layer of the metal layer, the TSV comprising a metallization being configured to electrically contact the metal layer from the rear surface of the substrate, wherein the TSV comprises a via hole, the via hole penetrating the substrate and the intermetal dielectric between the substrate and the metal layer, the via hole further penetrating the metal layer up to the top barrier layer, wherein the metallization of the TSV comprises a sidewall portion covering a sidewall of the TSV and a base portion covering the top barrier layer of the metal layer, wherein, at the metal layer, the sidewall portion of the metallization tapers conically to the base portion of the metallization.

2. The semiconductor device according to claim 1, wherein the TSV further comprises an insulating layer being arranged on a sidewall of the TSV, such that the substrate is electrically isolated from the metallization of the TSV.

3. The semiconductor device according to claim 1, wherein the metal layer further comprises a bottom barrier layer, the bottom barrier layer being arranged at a side of the metal layer facing the substrate, wherein the bottom barrier layer is penetrated by the TSV.

4. The semiconductor device according to claim 3, wherein the metal layer comprises aluminum and wherein the top barrier layer and the bottom barrier layer of the metal layer comprise titanium and/or titanium nitride.

5. The semiconductor device according to claim 1, further comprising a passivation layer covering the metallization within the TSV.

6. A sensor device comprising the semiconductor device according to claim 1, wherein the sensor device is in particular one of an ambient light sensor, a color sensor, a proximity sensor, a photon counting sensor, and a time-of-flight sensor behind an organic light emitting diode display.

7. A semiconductor device, comprising:

a substrate with a rear surface and a main surface, an intermetal dielectric arranged on the main surface of substrate, a metal layer embedded in the intermetal dielectric, the metal layer comprising a top barrier layer, wherein the top barrier layer is arranged at a side of the metal layer facing away from the substrate, and a through-substrate-via, TSV, reaching from the rear surface of the substrate to the top barrier layer of the metal layer, the TSV comprising a metallization being configured to electrically contact the metal layer from the rear surface of the substrate, wherein the TSV comprises a via hole, the via hole penetrating the substrate and the intermetal dielectric between the substrate and the metal layer, the via hole further penetrating the metal layer up to the top barrier layer, wherein the metallization of the TSV comprises a sidewall portion covering a sidewall of the TSV and a base portion covering the top barrier layer of the metal layer, wherein, at the metal layer, the sidewall portion of the metallization tapers conically to the base portion of the metallization, and wherein the metal layer, apart from the top barrier layer, forms a ring around the TSV, such that a side surface of the ring is in direct contact with the metallization of the TSV forming a contact area for establishing an electrical interconnection.

8. A semiconductor device, comprising:

a substrate with a rear surface and a main surface, an intermetal dielectric arranged on the main surface of substrate, a metal layer embedded in the intermetal dielectric, the metal layer comprising a top barrier layer, wherein the top barrier layer is arranged at a side of the metal layer facing away from the substrate, a through-substrate-via, TSV, reaching from the rear surface of the substrate to the top barrier layer of the metal layer, the TSV comprising a metallization being configured to electrically contact the metal layer from the rear surface of the substrate, wherein the TSV comprises a via hole, the via hole penetrating the substrate and the intermetal dielectric between the substrate and the metal layer, the via hole further penetrating the metal layer up to the top barrier layer, wherein the metallization of the TSV comprises a sidewall portion covering a sidewall of the TSV and a base portion covering the top barrier layer of the metal layer, wherein, at the metal layer, the sidewall portion of the metallization tapers conically to the base portion of the metallization, at least one further metal layer embedded in the intermetal dielectric, the further metal layer comprising a further top barrier layer, wherein the further top barrier layer is arranged at a side of the further metal layer facing away from the substrate, and wherein the further metal layer has a larger distance from the substrate than the metal layer, and at least one further TSV reaching from the rear surface of the substrate to the further top barrier layer of the further metal layer, the further TSV comprising a further metallization being configured to electrically contact the further metal layer from the rear surface of the substrate.

* * * * *